(12) United States Patent
Jang

(10) Patent No.: US 6,667,201 B2
(45) Date of Patent: Dec. 23, 2003

(54) METHOD FOR MANUFACTURING FLASH MEMORY CELL

(75) Inventor: Wen-Yueh Jang, Hsinchu (TW)

(73) Assignee: Windbond Electronics Corporation, Hsinchu (TW)

( * ) Notice: Subject to any disclaimer, the term of this patent is extended or adjusted under 35 U.S.C. 154(b) by 0 days.

(21) Appl. No.: 10/314,281

(22) Filed: Dec. 9, 2002

(65) Prior Publication Data

US 2003/0122183 A1 Jul. 3, 2003

Related U.S. Application Data

(62) Division of application No. 10/015,669, filed on Dec. 17, 2001, now Pat. No. 6,531,733.

(51) Int. Cl.[7] .......................................... H01L 21/8238
(52) U.S. Cl. ........................ 438/201; 438/207; 438/211
(58) Field of Search ........................ 257/314, 315–323, 257/330; 438/201, 207, 211, 257, 263, 259, 270, 296

(56) References Cited

U.S. PATENT DOCUMENTS

| 5,998,261 | A | * | 12/1999 | Hofmann et al. | ........... | 438/257 |
|---|---|---|---|---|---|---|
| 6,066,874 | A | | 5/2000 | Lin | .............................. | 257/315 |
| 6,078,076 | A | * | 6/2000 | Lin et al. | ..................... | 257/321 |
| 6,083,793 | A | | 7/2000 | Wu | .............................. | 438/270 |
| 6,255,689 | B1 | * | 7/2001 | Lee | .............................. | 257/314 |
| 6,391,720 | B1 | | 5/2002 | Sneelal | ........................ | 438/259 |
| 6,448,605 | B1 | * | 9/2002 | Chang | ........................ | 257/314 |

* cited by examiner

Primary Examiner—Phat X. Cao
Assistant Examiner—Hoai Pham

(57) ABSTRACT

The present invention discloses a method for manufacturing a flash memory cell having a horizontal surrounding gate (HSG). The flash memory cell of the present invention is formed on a trench of an isolation region, and a channel of the flash memory cell composed of a semiconductor film is encompassed and surrounded by a tunneling oxide layer, a floating gate, a dielectric layer, and a control gate in sequence. In addition, the floating gate and the control gate are also formed on the trench below the channel. Therefore, the leakage current of the channel can be reduced, and the short channel effect can be avoided. Furthermore, the coupling capacitor between the control gate and the floating gate is increased without increasing the cell size. Besides, the data can be programmed and erased by a Fowler-Nordheim (FN) tunneling effect.

10 Claims, 8 Drawing Sheets

METHOD FOR MANUFACTURING FLASH MEMORY CELL

The invention is a division of the application filed on Dec. 17, 2001, with an application Ser. No. 10/015,669 now U.S. Pat. No. 6,531,733 and entitled "STRUCTURE OF FLASH MEMORY CELL AND MEMORY FOR MANUFACTURING THE SAME". The subject matter of the above-identified application is incorporated by reference herein.

FIELD OF THE INVENTION

The present invention relates to a structure of a flash memory and a method for manufacturing the same, and more particularly, to a structure of a flash memory cell with source/drain programming and erasing and a method for manufacturing the same.

BACKGROUND OF THE INVENTION

As semiconductor process technologies continue enhancing, computers, telecommunication products, network products, and information appliances (IA) are developed vigorously. By scaling down device size, not only the integration of circuit devices can be increased, and the cost can be reduced, but also the performance, such as the changing speed of devices and the power consumption of devices, can be then improved, and the functions thereof, such as data storage, logic operation, and information processing, can be enhanced. Therefore, to scale down the size of semiconductor devices is the primary motivation to drive the semiconductor process technologies. Especially, for semiconductor memory devices that have a very important share in the market have strict demands about the diminution of device size.

As the increasing popularization of portable electric devices, imperious demands for light, handy, and dependable storage devices are induced. Regardless of digital cameras, notebooks, personal digital assistants (PDA), or mobile phones, etc, they all need a dependable and convenient method to store and transmit data. Because a flash memory is a kind of a non-volatile memory, and the data stored in the flash memory can be kept after the power is shut off, flash memory devices are widely applied in the portable electric products.

Referring to FIG. 1, FIG. 1 shows a cross-sectional view of a conventional stacked gate flash memory cell structure. In a flash memory cell 100, a tunneling oxide layer 108, a floating gate 110, a dielectric layer 112, and a control gate 114 of the flash memory cell 100 are stacked and formed on the semiconductor substrate 102 in sequence. A source 104 and a drain 106 of the flash memory cell 100 are formed by a thermal diffusion method or an ion implantation method to dope ions into the substrate 102. Typically, the floating gate 110 and the control gate 114 are composed of polysilicon, and thus the dielectric layer 112 is called as an inter-poly dielectric (IPD) layer. Besides, the dielectric layer 112 is usually formed by stacking three material layers, i.e. oxide/nitride/oxide (ONO), thereby to provide a better blocking ability for preventing the chargers within the floating gate 110 from entering the control gate 114.

Usually, the programming of the flash memory cell 100 is performed by a channel hot electron injection (CHEI) method. For example, the channel hot electron injection method is to set the substrate 102 and the source 104 to 0 V, and the drain 106 to about 3 V, and to connect the control gate 114 to a power of high voltage, such as 12 V. After conducting, the electrons of the source 104 are driven by the voltage of the drain 106 to pass through the channel region 105 and move toward the drain 106. The energy of electrons is increased by the acceleration from the high channel electric field, during the electrons passing through the channel region 105. Especially in the region that is adjacent to the drain 106, the energy of electrons is greatly increased, thereby inducing the hot electron effect. As a result of the hot electron effect, a part of the electrons have enough energy to exceed the potential barrier of the tunneling oxide layer 108. The attraction resulted from the high voltage of the control gate 114 drives the electrons to pass through the tunneling oxide layer 108 and inject into the floating gate 110, so as to complete the programming of the data.

In addition, the erasing action of the flash memory cell 100 is performed by a Fowler-Nordheim (FN) tunneling effect. The FN tunneling effect erasing method can be divided into a channel erasing method and a source/drain erasing method. In the channel erasing method, the control gate 114 is supplied with a negative voltage or is grounded, and the channel region 105 is supplied with a high voltage, such as 12 V, thereby attracting the electrons trapped within the floating gate 110 into the channel region 105 to complete the data erasing. In the source/drain erasing method, the control gate 114 is supplied with a negative voltage or is grounded, and the source 104 and/or the drain 106 are supplied with a high voltage, such as 12 V, thereby attracting the electrons trapped within the floating gate 110 into the source 104 and/or the drain 106 to complete the data erasing.

As semiconductor process technologies continue enhancing, although the supplied voltage needed for performing the programming and erasing of the flash memory cell 100 is reduced, yet, the electric field for programming and erasing the flash memory cell 100 still needs the same intensity. Without changing the programming/erasing voltage of the flash memory cell 100, it is very difficult to achieve the desired voltage of programming/erasing while the supplied voltage is reduced. At present, there are two methods can be used to reduce the programming/erasing voltage of the flash memory cell 100. The first method is to decrease the thickness of the tunneling oxide layer 108, and the second method is to increase the capacitor coupling ratio between the control gate 114 and the floating gate 110.

Since the thickness of the tunneling oxide layer 108 multiplies the electric field used to program/erase the flash memory cell 100 is proportional to the voltage for programming/erasing the flash memory cell 100, decreasing the thickness of the tunneling oxide layer 108 can reduce the voltage for programming/erasing the flash memory cell 100. However, in order to keep the reliability of the flash memory cell 100, the thickness of the tunneling oxide layer 108 is preferred to be more than 80 Å, and is about 100 Å more preferably. Hence, there is not much room left for decreasing the thickness of the tunneling oxide layer 108. In addition, increasing the capacitor coupling ratio between the control gate 114 and the floating gate 110 can increase the floating gate 110 voltage coupled from the control gate 114, so that the voltage needed to be supplied to program/erase the flash memory cell 100 can be reduced. However, in the typical process of the flash memory cell 100, increasing the capacitor coupling ratio between the control gate 114 and the floating gate 110 usually leads to an increase in the size of the flash memory cell 100 and the process cost.

Furthermore, since there is not much room left for decreasing the thickness of the tunneling oxide layer 108, when the supplied voltage is reduced, the electrons ejecting from the source 104 though the channel region 105 to the drain 106 cannot be controlled effectively. Especially, as the device size continues reducing to make the gate region decrease continuously, so that the leakage current of the sub-channel area far from the gate under the channel region 105 is getting more serious. Particularly, for the flash memory cell 100 using the source/drain erasing method, the source 104/drain 106 needs a larger junction depth. Thus, the leakage current is getting worse.

SUMMARY OF THE INVENTION

According to the aforementioned conventional flash memory cell structure, the leakage current between a source and a drain is getting worse, especially using a source/drain programming/erasing method of a FN tunneling effect. In addition, using a conventional method to manufacture a flash memory cell, the coupling capacitor between a control gate and a floating gate cannot be increased effectively without increasing the cell size and the processing cost.

Therefore, one major object of the present invention is to provide a structure of a flash memory cell having a horizontal surrounding gate and formed on a trench. A channel of the flash memory cell is a semiconductor film traversing over a portion of the trench, and surrounded and encompassed by a tunneling oxide layer, a floating gate, a dielectric layer, and a control gate in sequence, so that the current of the flash memory cell of the present invention can be conducted in the both sides of the channel region. Besides, the floating gate and the control gate are also formed in a hollow region between the channel and the bottom of the trench, thereby effectively improving the leakage current between a source and a drain, and increasing the current of the flash memory cell at on-state. Moreover, by increasing the depth of the trench, the overlap area between the floating gate and the control gate can be increased, so that a capacitor coupling ratio between the floating gate and the control gate can be raised. Therefore, without increasing the area of a device size, the capacitor coupling ratio can be enhanced to increase the coupling voltage of the floating gate, and to improve the programming/erasing efficiency of the device.

Another object of the present invention is that a gate region and a source/drain of a flash memory cell of the present invention are only separated with a tunneling oxide layer, and the depth of the trench is much larger than the junction depth of the source/drain. Thus, by applying a FN tunneling effect to program/erase a flash memory cell, a short tunnel effect can be avoided, and the programming/erasing of the flash memory cell can be easier to optimize.

A further object of the present invention is to provide a method for manufacturing a flash memory cell formed on a trench. After the trench with a size larger than a channel is formed on a channel region, the trench is filled with a sacrificial layer. Then, after a channel film is formed on the sacrificial layer, the sacrificial layer inside the trench is removed, so that the channel film traverses over the trench as a single-plank bridge, and a hollow region is formed between the channel film and the bottom of the trench. By changing the depth of the hollow region between the channel film and the bottom of the trench, the overlap area between a floating gate and a control gate sequentially formed in the hollow region can be adjusted to improve the capacitor coupling ratio between the floating gate and the control gate.

According to the aforementioned major object, the present invention further provides a structure of a flash memory cell, comprising: a substrate, wherein the substrate comprises an isolation region, a channel region, and a trench located on the isolation region formed thereon, and the size of the isolation region is larger than the size of the channel region, and the entire channel region is covered by the isolation region; a source and a drain located beside two sides of the channel region respectively; a crystallized semiconductor film traversed over a portion of the trench, wherein the crystallized semiconductor film is connected with the source and the drain respectively; an oxide layer surrounding and encompassing the crystallized semiconductor film; a floating gate, wherein the oxide layer is surrounded and encompassed by a portion of the floating gate, and the isolation region and the trench are covered by another portion of the floating gate, and the material of the floating gate is polysilicon; a dielectric layer, wherein the portion of the floating gate is surrounded and encompassed by a portion of the dielectric layer, and another portion of the floating gate is covered by another portion of the dielectric layer; and a control gate, wherein the portion of the dielectric layer is surrounded and encompassed by the control gate, and another portion of the dielectric layer and a portion of the substrate are covered by the control gate, and the material of the control gate is polysilicon or polycide.

According to the further object mentioned above, the present invention further provides a method for manufacturing a flash memory cell, the method comprising: providing a substrate, wherein the substrate comprises an isolation region and a channel region formed thereon, and the size of the isolation region is larger than the size of the channel region, and the entire channel region is covered by the isolation region, and the isolation region is filled with an insulating material; removing a portion of the insulating material in the isolation region to form a trench on the isolation region in the substrate; forming a sacrificial layer to cover the isolation region and the trench, wherein the trench is filled with the sacrificial layer; forming an amorphous semiconductor film to cover the substrate and the sacrificial layer; performing a re-crystallization step to make the amorphous semiconductor film located on the isolation region change into a crystallized semiconductor film, and to make the amorphous semiconductor film covered on the substrate integrate into the substrate, wherein the temperature of the re-crystallization step is between about 500° C. and about 600° C., and the duration of the re-crystallization step is between about 0.5 hour and about 6 hours; removing a portion of the crystallized semiconductor film to leave another portion of the crystallized semiconductor film located on the channel region, and to expose a portion of the sacrificial layer; removing the sacrificial layer to expose a bottom of the trench, so as to form a hollow region constituted by another portion of the crystallized semiconductor film and the bottom of the trench, and to form a plurality of slots between another portion of the crystallized semiconductor film and the trench; forming an oxide layer to surround and encompass the remaining portion of the crystallized semiconductor film, wherein the oxide layer is a tunneling oxide layer; forming a floating gate to surround and encompass the oxide layer, and to cover a sidewall and a bottom of the hollow region, wherein the material of the floating gate is polysilicon; forming a dielectric layer to cover the floating gate, wherein the dielectric layer is a stacked structure composed of oxide/nitride/oxide; and forming a control gate to cover the dielectric layer, wherein the material of the control gate is polysilicon or polycide. Furthermore, a source and a drain of the flash memory cell of the present invention can be formed before the formation of the amorphous semiconductor film, or after the formation of the control gate, by using, for example, an ion implantation method, to dope ions beside two sides of the channel region.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein:

FIG. 2 to FIG. 15 are flow schematic diagrams of manufacturing a flash memory cell in accordance with a preferred embodiment of the present invention, wherein FIG. 3 is a top view of FIG. 2, FIG. 7 is a top view of FIG. 6, FIG. 8 is a top view of FIG. 9, FIG. 10 is a top view of FIG. 11 and FIG. 12, and FIG. 13 is a top view of FIG. 14 and FIG. 15.

DETAILED DESCRIPTION OF THE PREFERRED EMBODIMENT

The present invention discloses a structure of a flash memory cell and a method for manufacturing the same. The flash memory cell of the present invention has a horizontal surrounding gate, and a FN tunneling effect can be used to program and erase the data. In addition to the leakage current between a source and a drain can be improved effectively and the cell current at on-state can be increased, the capacitor coupling between control gate and floating gate can be increased without increasing the device size. In order to make the illustration of the present invention more explicitly and completely, the following description and the drawings from the FIG. 2 to FIG. 15 are stated.

Figure 1:
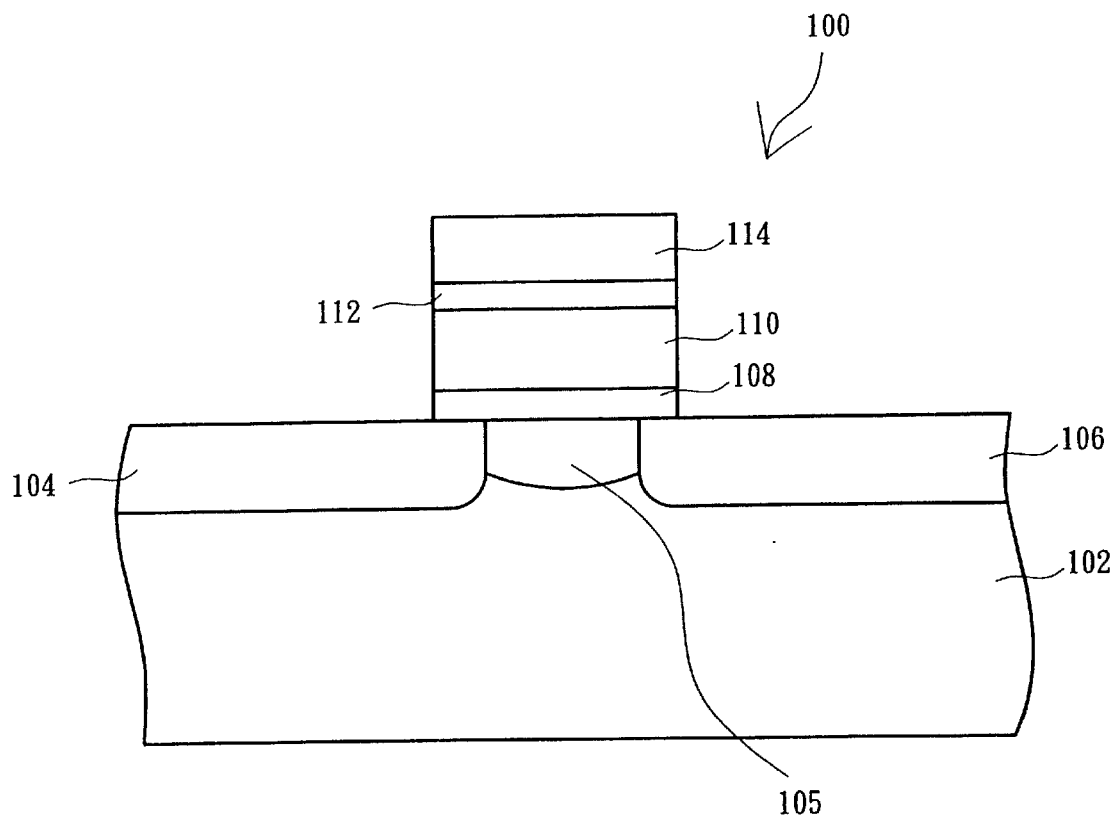
FIG. 1 is a cross-sectional view of a conventional stacked gate flash memory cell structure.
Figure 2:
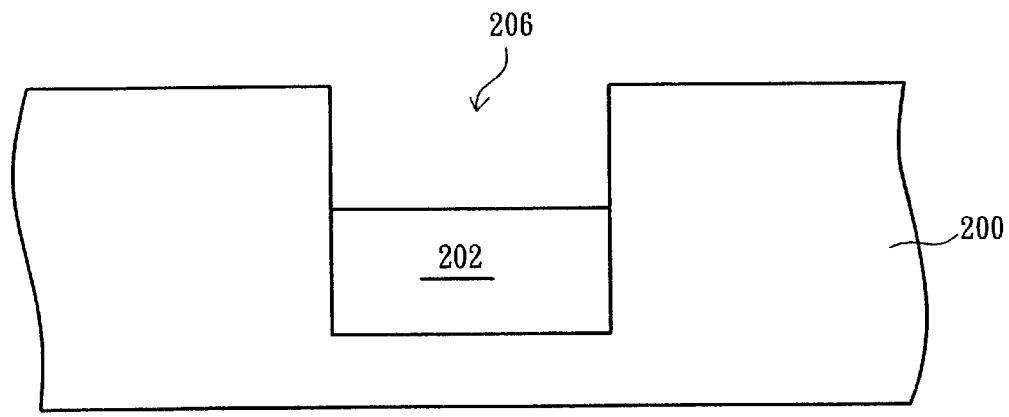
Figure 3:
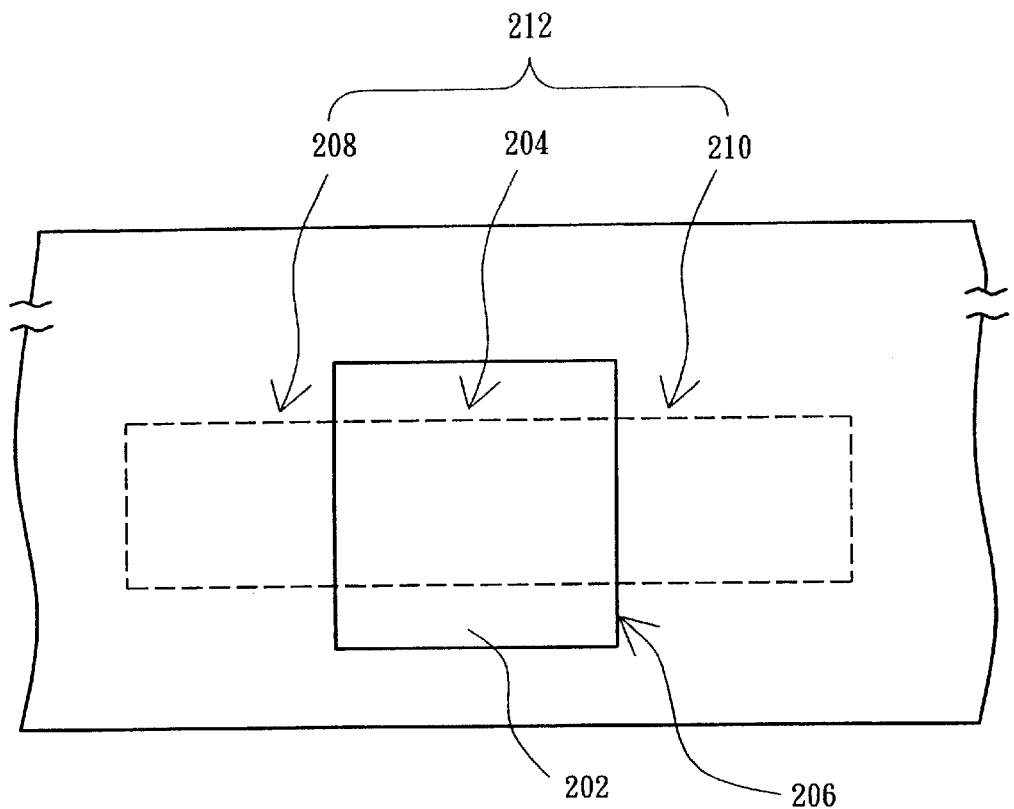

Referring to FIG. 2 and FIG. 3, FIG. 3 is a top view of FIG. 2. First, a plurality of isolation regions 202 (only show the isolation region 202 located in a predetermined device region 212) are formed on a semiconductor substrate 200, and a portion of the isolation regions 202 are used to isolate devices, and another portion of the isolation regions 202 are used to provide channel regions for forming devices. The predetermined device region 212 mainly comprises a source region 208, a channel region 204, and a drain region 210. At present, the isolation region 202 of a semiconductor device is usually fabricated by using a shallow trench isolation (STI) process. A trench-like opening is first formed on the substrate 200, and the trench-like opening is then filled with an insulating material to form the isolation region 202. In the present invention, the size of the isolation region 202 is larger than that of the channel region 204, as shown in FIG. 3. Then, a portion of the insulating material is removed by using, for example, an etching method, so as to form a shallower trench 206 on the isolation region 202, as shown in FIG. 2. In addition, the size of the trench 206 is approximate to the size of the isolation region 202.

Figure 4:
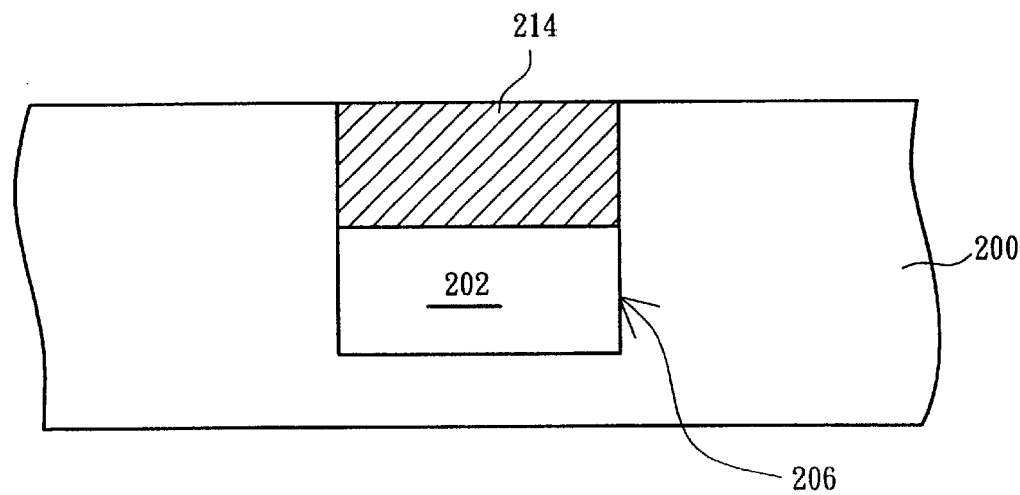

Referring to FIG. 4, after the trench 206 is formed, a sacrificial layer 214 is formed to cover the substrate 200, the isolation region 202, and the trench 206, and to fill the trench 206. The sacrificial layer 214 is preferred to have a chemical mechanical polishing (CMP) rate similar to the substrate 200, and to have a high etching selectivity with respect to both the substrate 200 and the isolation region 202. The sacrificial layer 214 is made of a dielectric material, such as silicon nitride and silicon oxide, etc. Then, the sacrificial layer 214 is planarized by, for example, a chemical mechanical polishing method, to remove the sacrificial layer 214 located on the substrate 200 and to reserve the sacrificial layer 214 in the trench 206, so as to provide a planar surface.

Figure 5:
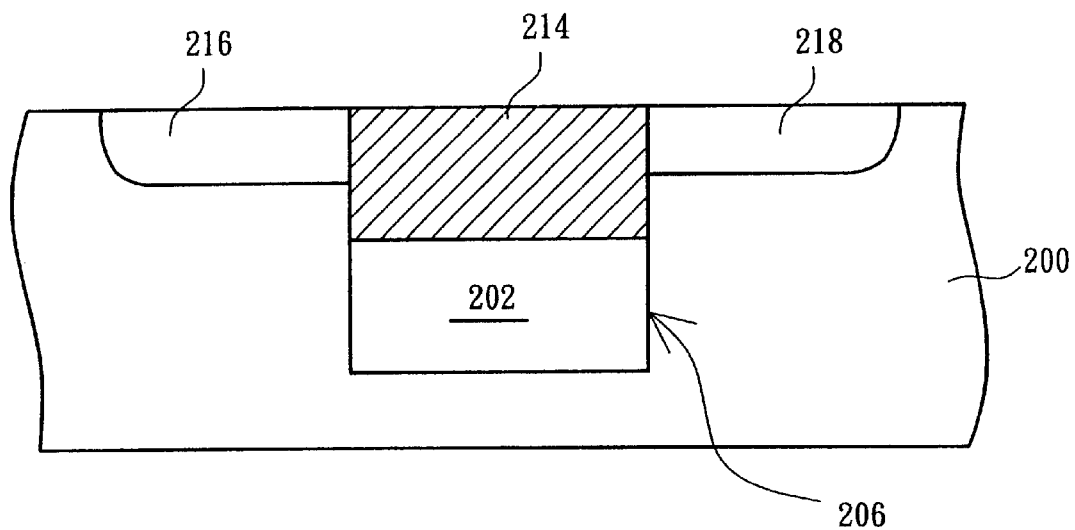

Referring to FIG. 5, ions are doped into the source region 208 and the drain region 210 on the substrate 200 by, for example, an implantation method, so that a source 216 and a drain 218 are formed beside two sides of the channel region 204. For N type flash memory cell, the source 216 and the drain 218 are doped with $N^+$ type ions, and for P type flash memory cell, the source 216 and the drain 218 are doped with $P^+$ type ions. Besides, the source 216 and the drain 218 can be formed by an implantation method, etc, after a control gate structure of the flash memory cell is formed.

Figure 6:
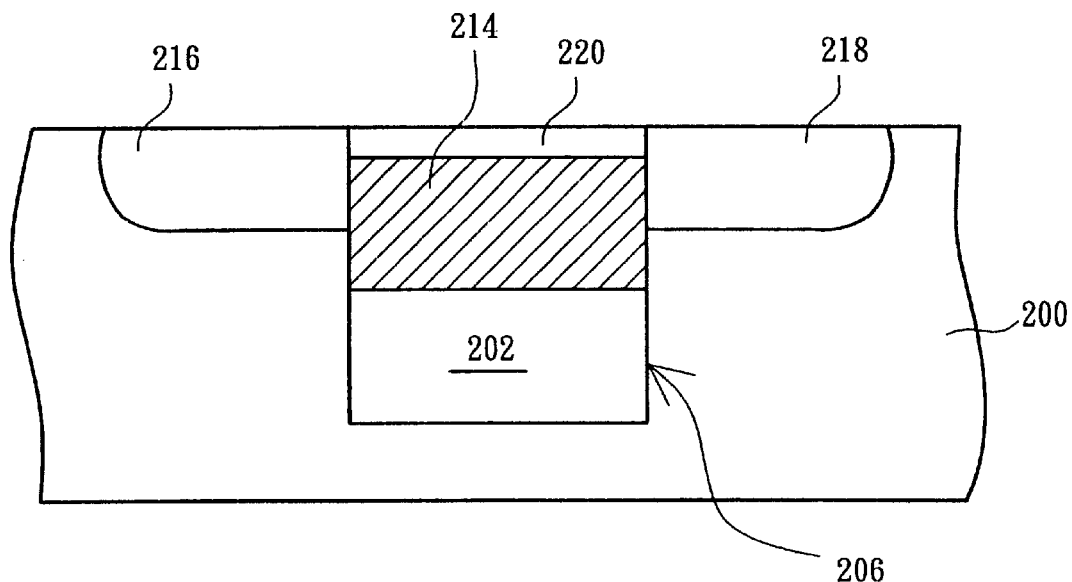
Figure 7:
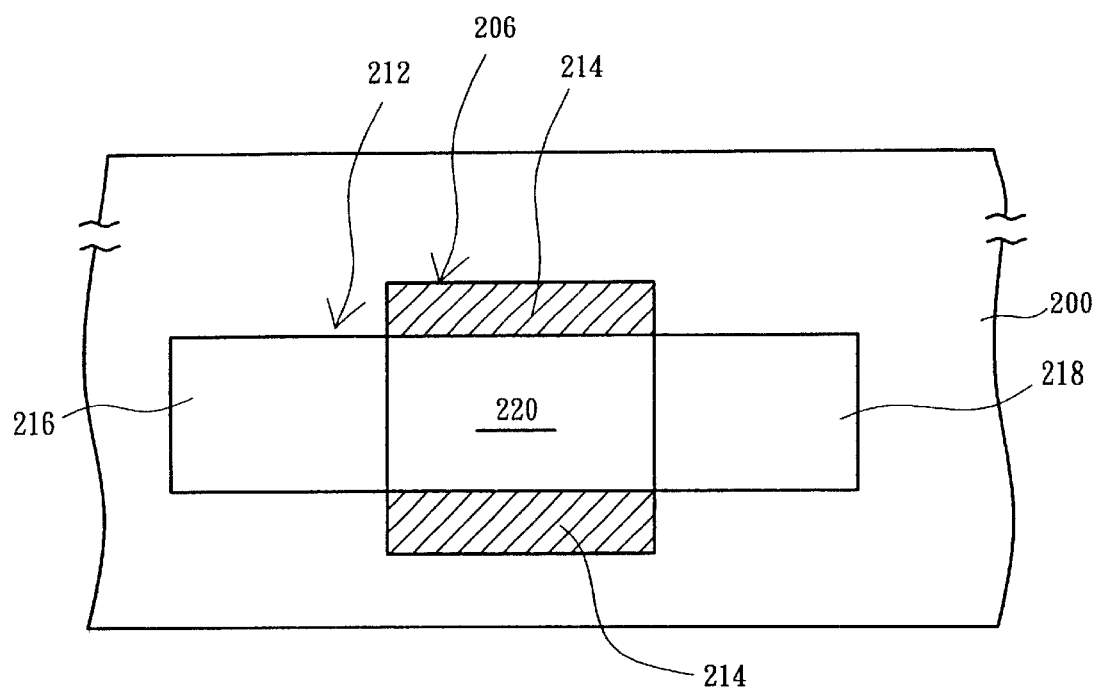

Referring to FIG. 6 and FIG. 7, FIG. 7 is a top view of the structure shown in FIG. 6. An amorphous semiconductor film (not shown) is first deposited to cover the substrate 200, the source 216, the drain 218, and the sacrificial layer 214. A re-crystallization step is performed on the amorphous semiconductor film by, for example, a solid phase epitaxy technique, and by using the substrate 200 as a seed. With the lateral epitaxy crystallized effect of the amorphous semiconductor film, the amorphous semiconductor film will grow alone the lattices direction of the substrate 200, so as to make the amorphous semiconductor film change into a single crystal silicon semiconductor film and integrate with the substrate 200. Furthermore, a crystallized semiconductor film 220 is formed on the sacrificial layer 214 on the isolation region 202. The re-crystallization step of the amorphous semiconductor film is performed for a duration between about 0.5 hour and about 6 hours under a temperature between about 500° C. and about 600° C. Subsequently, the crystallized semiconductor film 220 is doped with N type impurity (for P type flash memory cell) or P type impurity (for N type flash memory cell). However, the doping step can also be performed in-situ while the amorphous semiconductor layer is deposited. The crystallized semiconductor film 220 is connected with the source 216 and the drain 218 respectively to be used as the channel of the flash memory cell of the present invention. Then, the crystallized semiconductor film 220 outside the device region 212 is removed to expose a portion of the sacrificial layer 214, as shown in FIG. 7.

Figure 8:
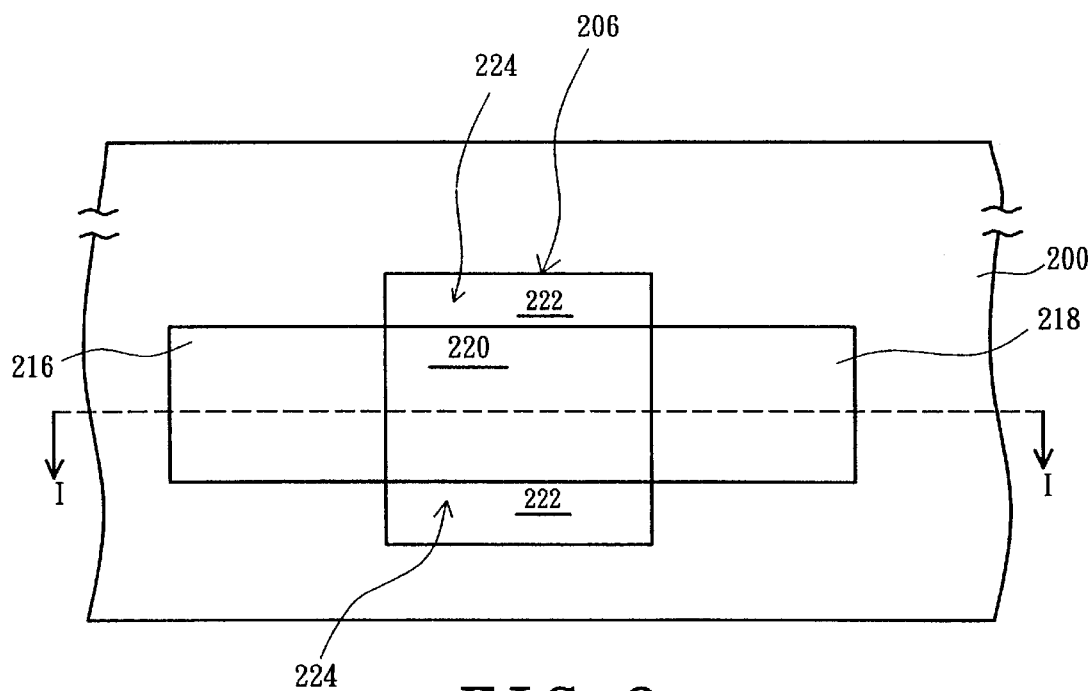
Figure 9:
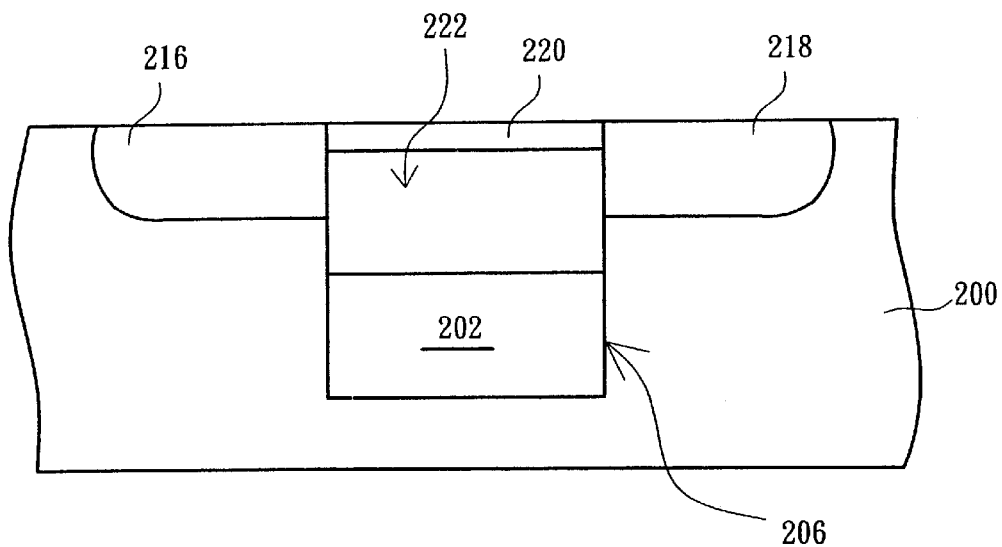

Referring to FIG. 8 and FIG. 9 simultaneously, FIG. 9 is a cross-sectional diagram alone hatch I—I in FIG. 8. The remainder of the sacrificial layer 214 is removed to expose the bottom of the trench 206 by performing an etching step along the exposed portion of the sacrificial layer 214. Accordingly, a hollow region 222 is formed between the crystallized semiconductor film 220 and the bottom of the trench 206, as shown in FIG. 9. Furthermore, the crystallized semiconductor film 220 traverses over a portion of the trench 206 as a single-plank bridge, and a plurality of slots 224 are formed between the crystallized semiconductor film 220 and the trench 206, as shown in FIG. 8.

Figure 10:
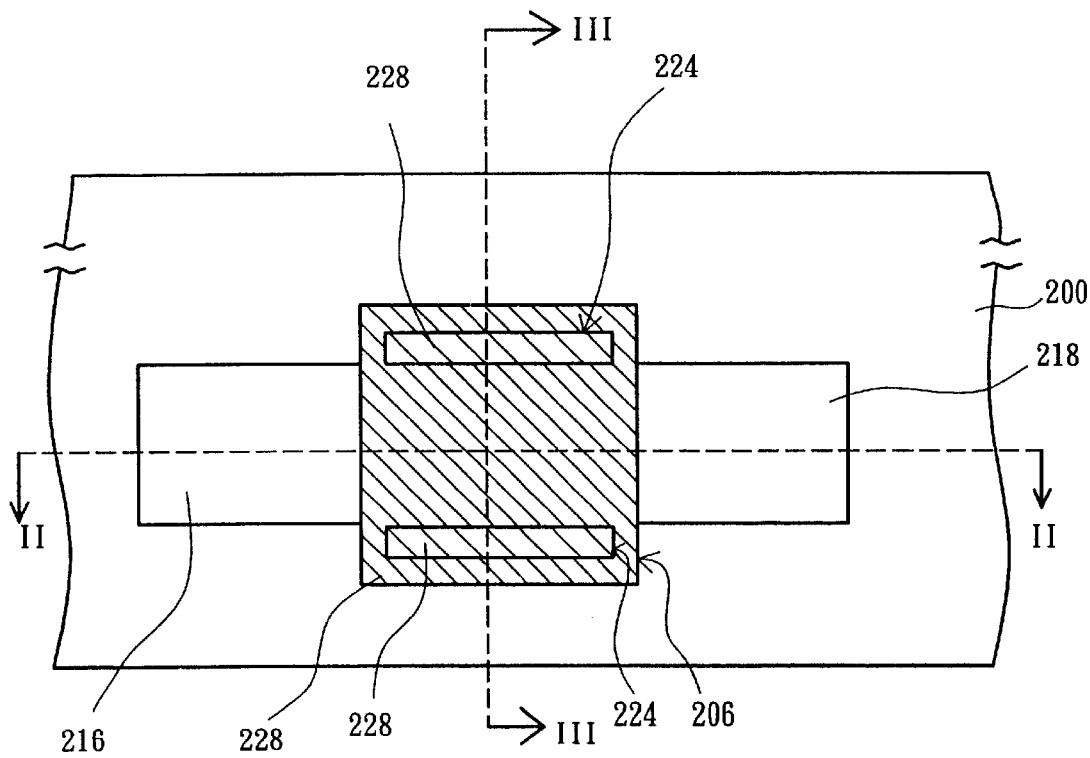
Figure 11:
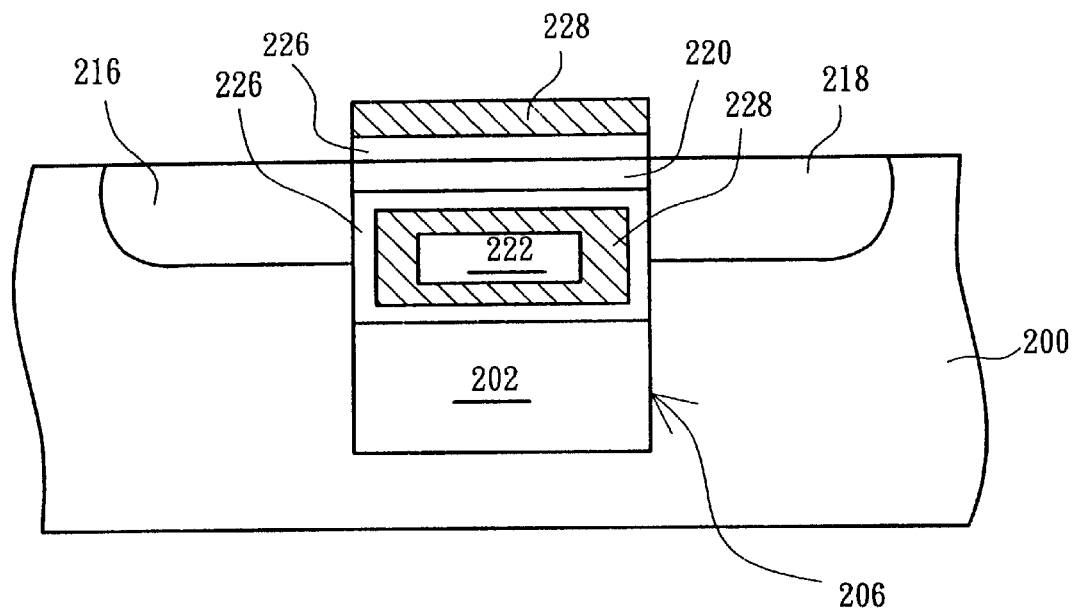
Figure 12:
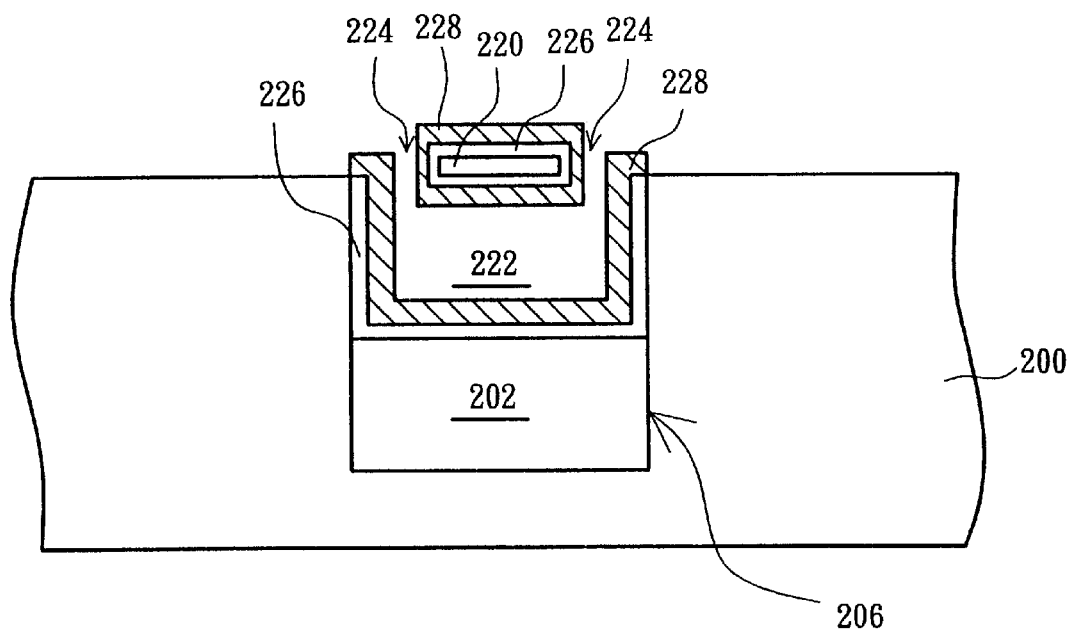

Then, referring to FIG. 10 to FIG. 12, FIG. 11 is a cross-sectional diagram alone hatch II—II in FIG. 10, and FIG. 12 is a cross-sectional diagram alone hatch III—III in FIG. 10. An oxide layer 226 is first formed to surround and encompass the crystallized semiconductor film 220, and to cover the substrate 200 and the trench 206, wherein the oxide layer 226 is used as a tunneling oxide layer of the flash memory cell of the present invention. In order to keep the device reliability, the thickness of the oxide layer 226 is preferred to be more than 80 Å, and is about 100 Å more preferably. Subsequently, a material, such as polysilicon and amorphous, of a floating gate 228 is deposited to surround and encompass the oxide layer 226 surrounding and encompassing the crystallized semiconductor film 220, and to cover the oxide layer 226 in the trench 206 and on the substrate 200. The material of the floating gate 228 and the oxide layer 226 outside the trench 206 are removed by, for example, an anisotropic etching method, so that a structure shown in FIG. 11 and FIG. 12 is formed. As shown in FIG. 10 and FIG. 12, the slots 224 cannot be covered up or filled to make sure that the subsequent process can be performed successfully.

Figure 13:
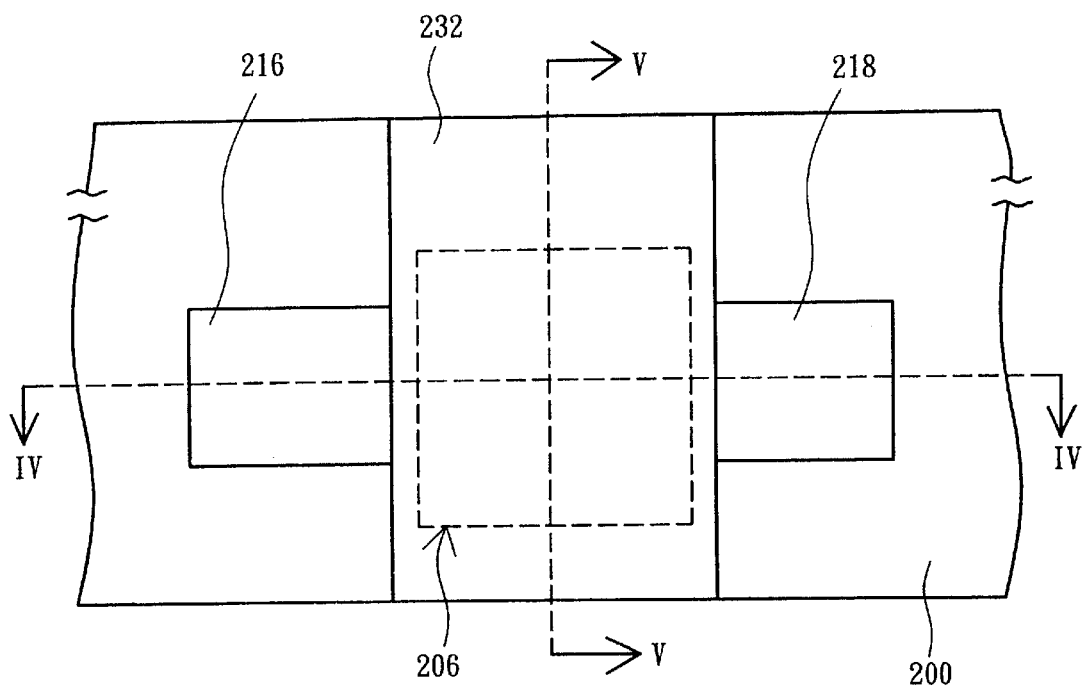
Figure 14:
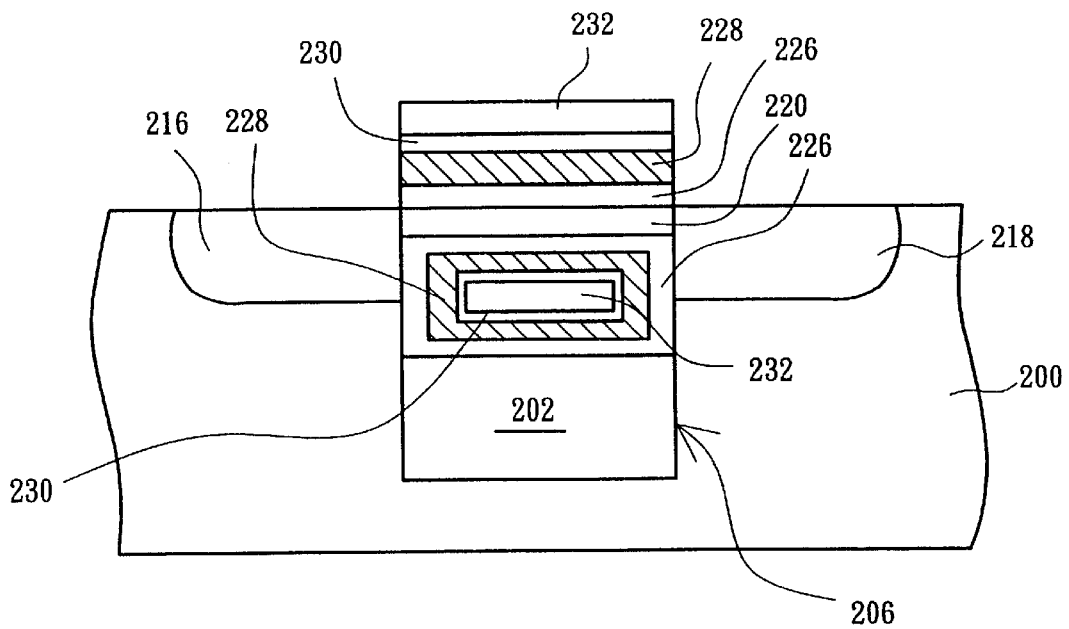
Figure 15:
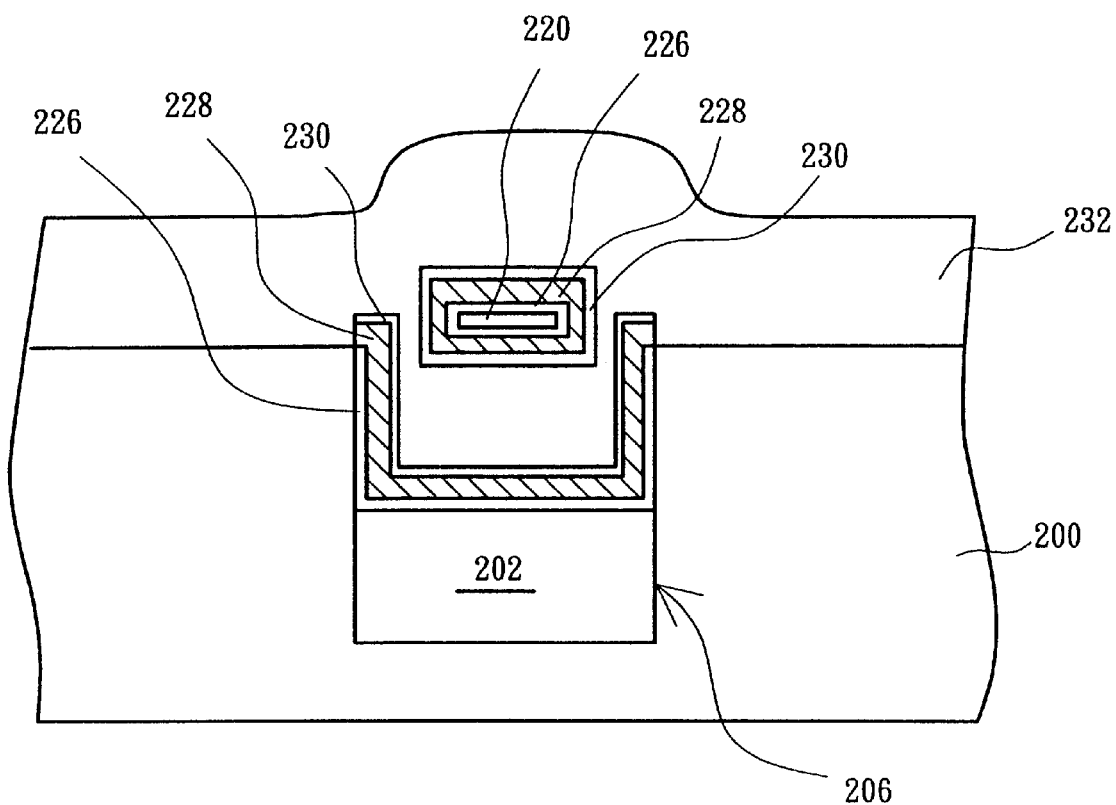

Referring to FIG. 13 to FIG. 15, FIG. 14 is a cross-sectional diagram alone hatch IV—IV in FIG. 13, and FIG. 15 is a cross-sectional diagram alone hatch V—V in FIG. 13. After the floating gate 228 is formed, a dielectric layer 230 is first formed to surround and encompass the floating gate 228 surrounding and encompassing the crystallized semiconductor film 220, and cover the floating gate 228 located in the trench 206 and the substrate 200. For example, the dielectric layer 230 can be an inter-poly dielectric layer, and the dielectric layer 230 can be an oxide/nitride/oxide (ONO) stacked material layer to provide a preferred blocking ability for preventing the chargers within the floating gate 228 from entering a control gate 232 though the dielectric layer 230. The unnecessary dielectric layer 230 on the substrate 200 is removed. A material, such as amorphous, polysilicon, or polycide, of the control gate 232 is deposited to surround and encompass the dielectric layer 230 surrounding and encompassing the crystallized semiconductor film 220, and cover the dielectric layer 230 in the trench 206 and the substrate 200. Then, the control gate 232 is patterned to complete the structure of the flash memory cell of the present invention, as shown in FIG. 14 and FIG. 15.

One characteristic of the present invention is that the overlap area between the floating gate 228 and the control gate 232 can be adjusted by varying the depth of the hollow region 222 between the crystallized semiconductor film 220 and the bottom of the trench 206. Hence, the capacitor coupling ratio between the floating gate 228 and the control gate 232 is increased, so that an objective for effectively improving the programming/erasing voltage of the flash memory cell can be achieved.

The programming, of the flash memory cell of the present invention can be performed by, for example, a FN tunneling effect and a channel hot electron injection (CHEI) method. While data programming is performed by a FN tunneling effect, the source 216 and/or drain 218 are connected with a negative voltage, such as about −6 V, and the connect gate 232 is connected with a positive voltage, such as 6 V. Because the floating gate 228 in the trench 206 and the source 216/drain 218 are separated by the oxide layer 226, and the trench 206 is deeper than the source 216/drain 218, so that a short channel effect cannot be induced by both the greater junction depth and the impurity gradient of the source 216/drain 218. Therefore, the electrons of the source 216/drain 218 are attracted to pass through the oxide layer 226 in the trench 206 into the floating gate 228 by a relative higher voltage of the control gate 232. Besides, while the data programming is performed by a channel hot electron injection method, the source 216 is grounded or set to 0V, and the drain 218 voltage is set to about 3 V, and the control gate 232 is connected with a high voltage, such as about 12 V. The electrons of the source 216 are driven by the difference of voltage between the source 216 and the drain 218 to pass through the channel, i.e. the crystallized semiconductor film 220, and move toward the drain 218. The electrons are accelerated to have an increasing energy by the high channel electric field while moving in the crystallized semiconductor film 220. Especially, as the electrons are adjacent to the drain 218, the energy of the electrons is greatly increased, thereby inducing the hot electron effect. As a result of the hot electron effect, the electrons have enough energy to exceed the potential barrier of the oxide layer 226. At the same time, the attraction resulted from the high voltage of the control gate 232 will drive the electrons to pass through the oxide layer 226 and inject into the floating gate 228 so as to complete the data programming.

The erasing action of the flash memory cell of the present invention can be performed by, for example, a source/drain erasing method by means of the FN tunneling effect. The control gate 232 is grounded or supplied with a negative voltage, and the source 216 and/or drain 218 are supplied with a high voltage, such as about 12V. The electrons of the floating gate 228 are attracted to pass through the oxide layer 226 directly, into the source 216 and/or drain 218, so that the erasing of the data is completed.

An advantage of the present invention is because that the channel of the flash memory cell structure in the present invention is a crystallized semiconductor film surrounded and encompassed by a floating gate and a control gate. Therefore, the leakage current between a source and a drain can be improved effectively, and current can be conducted in the both sides of the channel, so that the flash memory cell current at on-state can be enhanced.

Another advantage of the present invention is that the overlap area between a floating gate and a control gate is increased by just increasing the depth of a trench without increasing the size of the flash memory cell. Therefore, the capacitor coupling ratio between the floating and the control gate is increased, and the objective for reducing the programming/erasing voltage of the flash memory cell is achieved.

A further advantage of the present invention is because that a floating gate in a trench and a source/drain are just separated by an oxide layer, and the floating gate is deeper than the source/drain. Thus, a short channel effect can be avoided, and a FN tunneling effect can be used to programming/erasing data directly. Furthermore, the operating efficiency of devices can be optimized easily.

As is understood by a person skilled in the art, the foregoing preferred embodiments of the present invention are illustrations of the present invention rather than limitations of the present invention. It is intended to cover various modifications and similar arrangements included within the spirit and scope of the appended claims, the scope of which should be accorded the broadest interpretation so as to encompass all such modifications and similar structure.

What is claimed is:

1. A method for manufacturing a flash memory cell, comprising:

provide a substrate comprising an isolation region and a channel region formed thereon, wherein the size of the isolation region and the size of a trench are both larger than the size of the channel region, and the channel region is all covered by both the isolation region and the trench;

forming a sacrificial layer to cover the isolation region and the trench, wherein the trench is filled with the sacrificial layer;

forming a first crystallized semiconductor film on the channel region and to cover a portion of the sacrificial layer;

removing the sacrificial layer to expose the bottom and the sidewall of the trench, so as to form a hollow region constituted by the first crystallized semiconductor film and the bottom and the sidewall of the trench, and to form a plurality of slots between the first crystallized semiconductor film and the trench;

forming an oxide layer, and the first crystallized semiconductor film is surrounded and encompassed by a portion of the oxide layer, and the bottom and the sidewall of the trench are covered by an other portion of the oxide layer;

forming a floating gate, and the portion of the oxide layer is surrounded and encompassed by a portion of the floating gate, and the other portion of the oxide layer is covered by an other portion of the floating gate;

forming a dielectric layer, and the portion of the floating gate is surrounded and encompassed by a portion of the dielectric layer, and the other portion of the floating gate is covered by an other portion of the dielectric layer; and forming a control gate to cover the dielectric layer.

2. The method for manufacturing the flash memory cell according to claim 1, wherein before the step of forming the first crystallized semiconductor film is performed, the method further comprises forming a source and a drain in the substrate, and the source and the drain are located respectively beside two sides of the channel region.

3. The method for manufacturing the flash memory cell according to claim 1, wherein after the step of forming the control gate is performed, the method further comprises forming a source and a drain in the substrate, and the source and the drain are located respectively beside two sides of the channel region.

4. The method for manufacturing the flash memory cell according to claim 1, wherein the sacrificial layer has a high etching selectivity to the substrate and the isolation region, and a chemical mechanical polishing (CMP) rate of the sacrificial layer is approximately equal to a chemical mechanical polishing rate of the substrate.

5. The method for manufacturing the flash memory cell according to claim 1, wherein the step of forming the first crystallized semiconductor film further comprises:

forming an amorphous semiconductor film to cover the substrate and the sacrificial layer;

performing a re-crystallization step to change the amorphous semiconductor film covered on the sacrificial layer into a second crystallized semiconductor film; and removing the second crystallized semiconductor film outside the channel region, wherein the remainder of the second crystallized semiconductor film is the first crystallized semiconductor film.

6. The method for manufacturing the flash memory cell according to claim 5, wherein the temperature of performing the re-crystallization step is between about 500° C. and about 600° C.

7. The method for manufacturing the flash memory cell according to claim 5, wherein the duration of performing the re-crystallization step is between about 0.5 hour and about 6 hours.

8. The method for manufacturing the flash memory cell according to claim 1, wherein the first crystallized semiconductor film is a channel of the flash memory cell.

9. The method for manufacturing the flash memory cell according to claim 1, wherein the material of the floating gate is polysilicon, and the material of the control gate is selected from the group consisting of polysilicon and polycide.

10. The method for manufacturing the flash memory cell according to claim 1, wherein the dielectric layer is an inter-poly dielectric (IPD) layer, and the dielectric layer is an oxide/nitride/oxide (ONO) stacked structure.

* * * * *